US006881940B1

(12) United States Patent
Yoshimura

(10) Patent No.: US 6,881,940 B1
(45) Date of Patent: Apr. 19, 2005

(54) IMAGE PROCESSING APPARATUS AND METHOD

(75) Inventor: Shinichi Yoshimura, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/624,718

(22) Filed: Jul. 25, 2000

(30) Foreign Application Priority Data

Aug. 2, 1999 (JP) .......................................... P11-218349

(51) Int. Cl.[7] .............................................. H01L 27/00
(52) U.S. Cl. .................................... 250/208.1; 348/294
(58) Field of Search ....................... 250/208.1; 348/294, 348/302, 312, 362, 221.1, 222.1; 356/3, 3.01, 4.01, 4.07; 396/89, 125, 127

(56) References Cited

U.S. PATENT DOCUMENTS

| 5,726,439 | A | * | 3/1998 | Miyawaki et al. | ....... | 250/208.1 |
| 5,926,057 | A | * | 7/1999 | Ogawa et al. | ............. | 327/359 |
| 6,166,583 | A | * | 12/2000 | Kochi et al. | ................ | 327/407 |
| 6,449,378 | B1 | * | 9/2002 | Yoshida et al. | ............. | 382/100 |

FOREIGN PATENT DOCUMENTS

| JP | 7-105342 | * | 4/1995 | ............. | G06T/1/00 |
| JP | 7-235177 | | 5/1995 | | |

* cited by examiner

Primary Examiner—Edward J. Glick
Assistant Examiner—Chih-Cheng Kao
(74) Attorney, Agent, or Firm—Bell, Boyd & Lloyd LLC

(57) ABSTRACT

The invention provides an image processing apparatus and method wherein image signals can be arithmetically processed on the real-time basis. Infrared rays introduced into a light reception section are photoelectrically converted in synchronism with a reset pulse signal supplied from a timing generator and are outputted to an amplification section in synchronism with a light reception section transfer pulse signal supplied from the timing generator. The signal inputted to the amplification section is amplified to a level necessary for processing in an apparatus in the following stage in synchronism with an amplification section drive pulse signal supplied thereto from the timing generator, and outputted to an arithmetic operation section. The signal inputted to the arithmetic operation section is temporarily stored into a storage section, and a predetermined arithmetic operation designated by an arithmetic operation selection signal from an arithmetic operation control section is performed for the signal by a comparison section to produce a binary digitized signal. The binary digitized signal is outputted to an outputting section. The signal inputted to the outputting section is outputted as a pixel signal over a common signal line in synchronism with a selection signal from a horizontal scanning circuit.

8 Claims, 11 Drawing Sheets

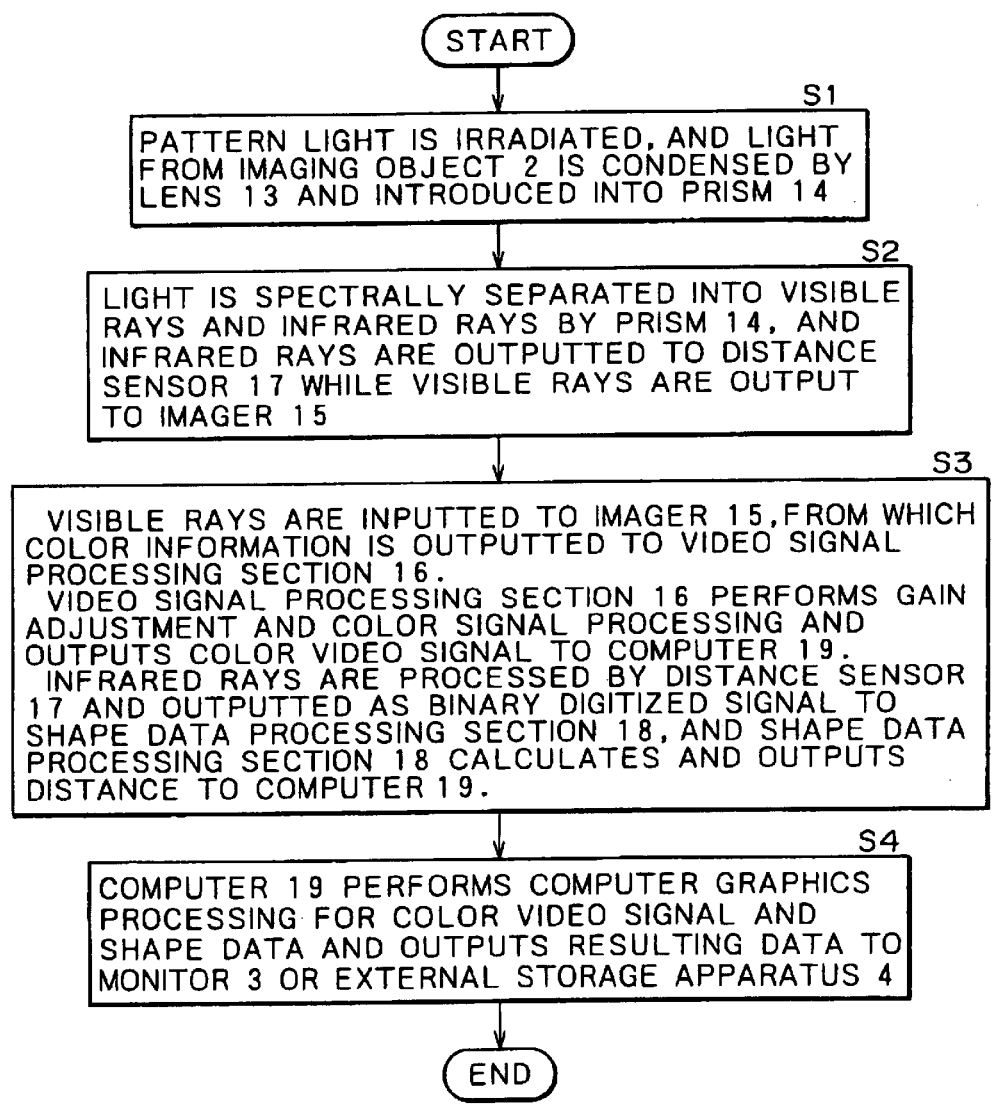

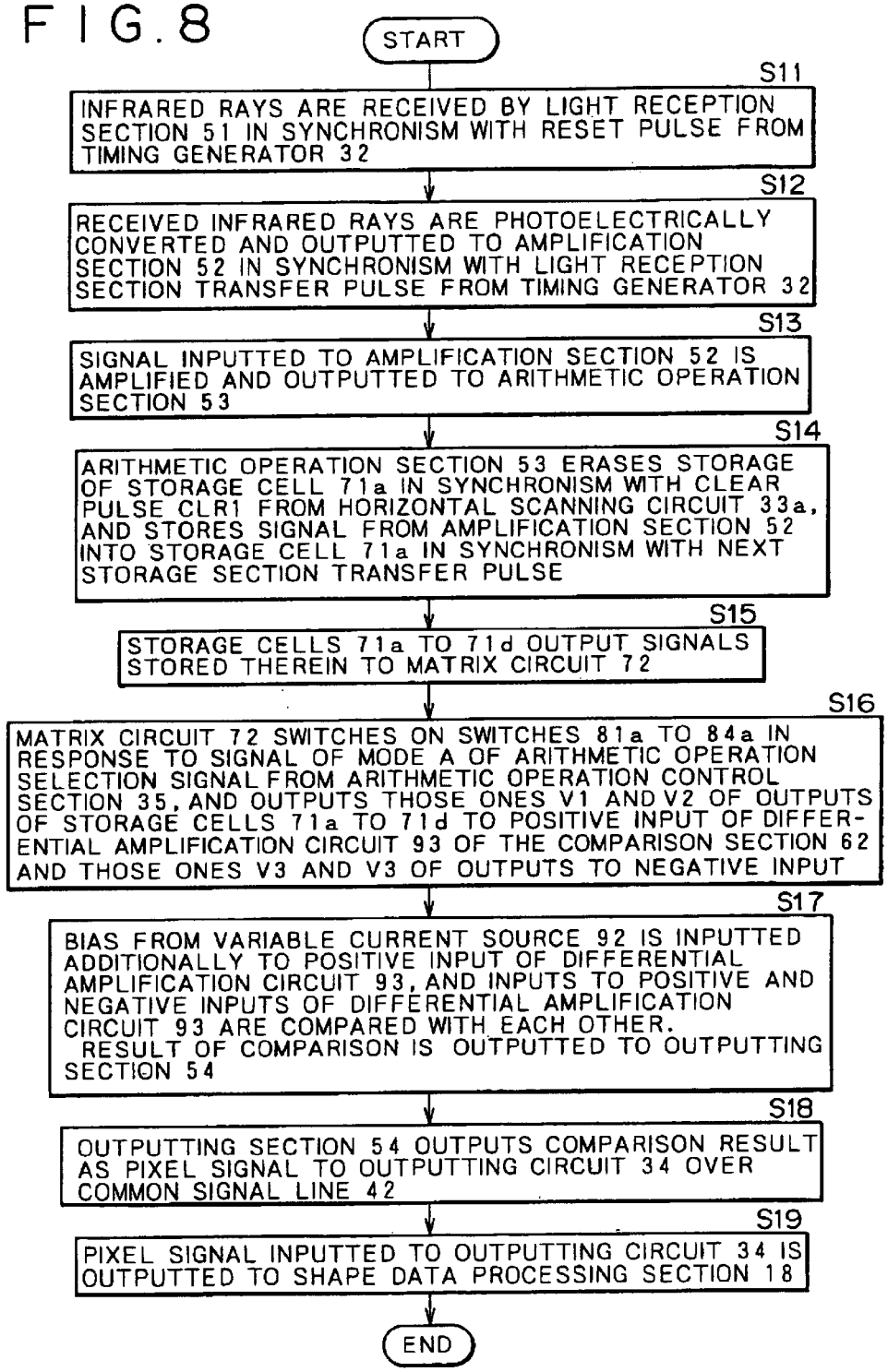

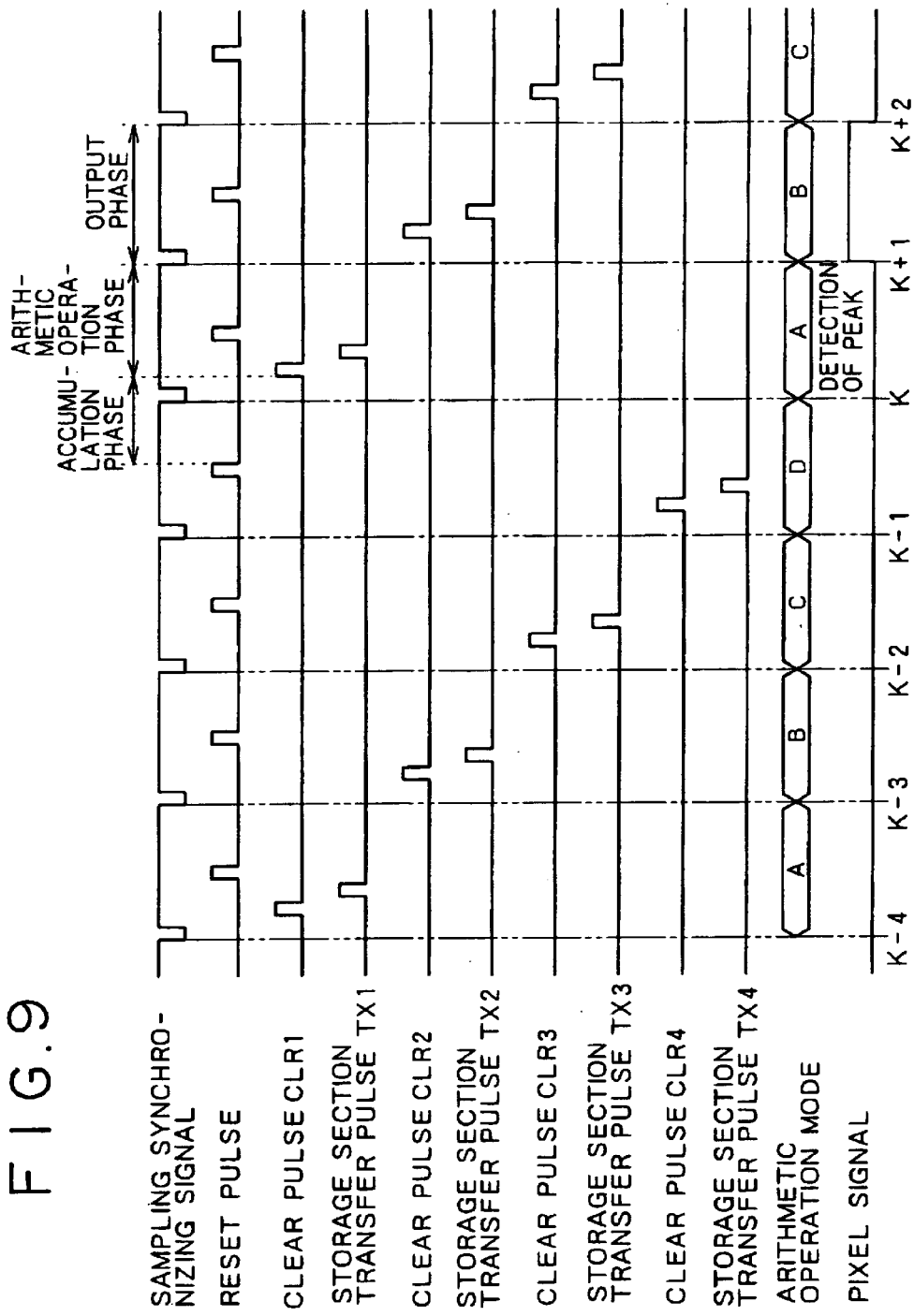

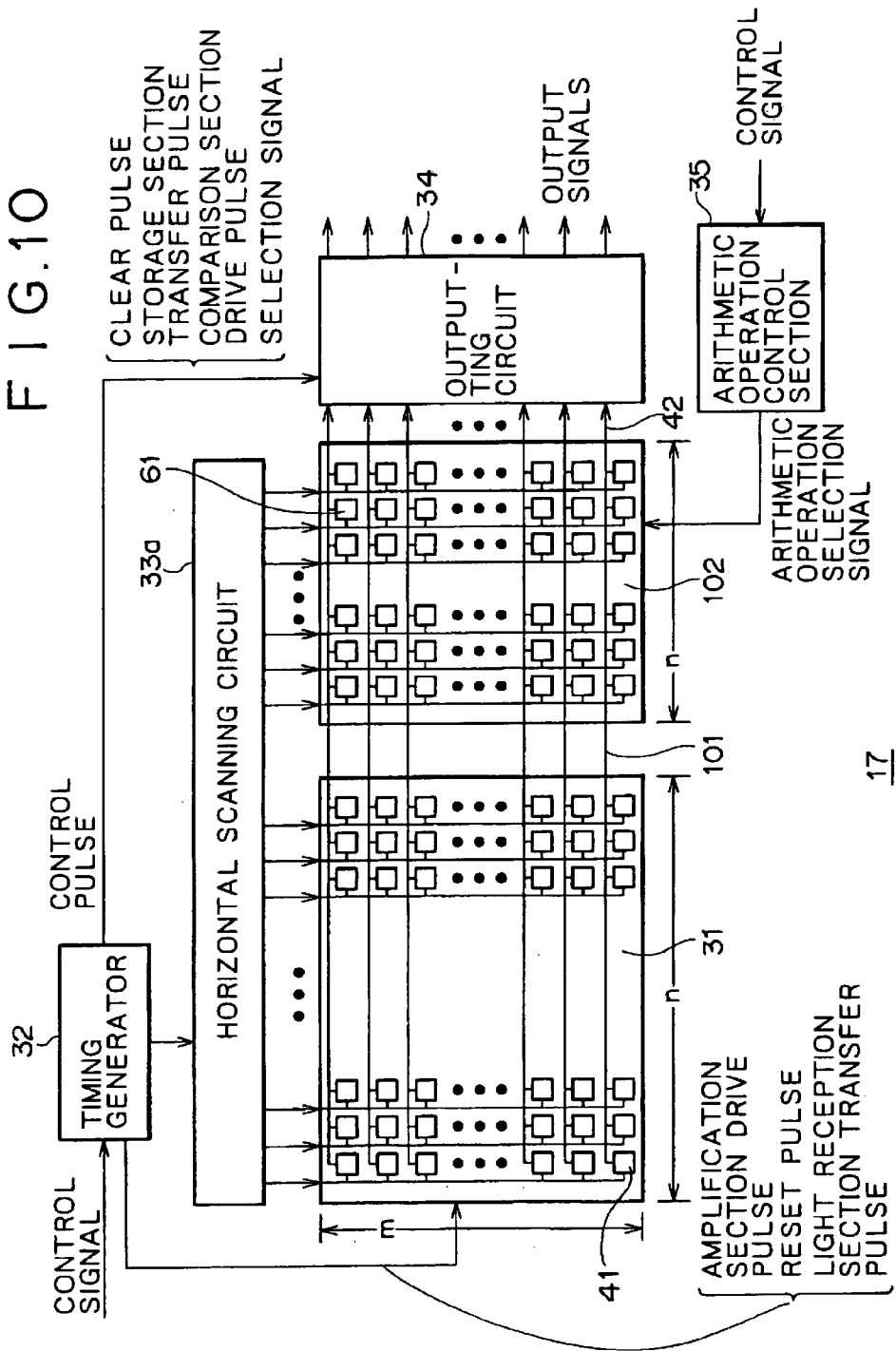

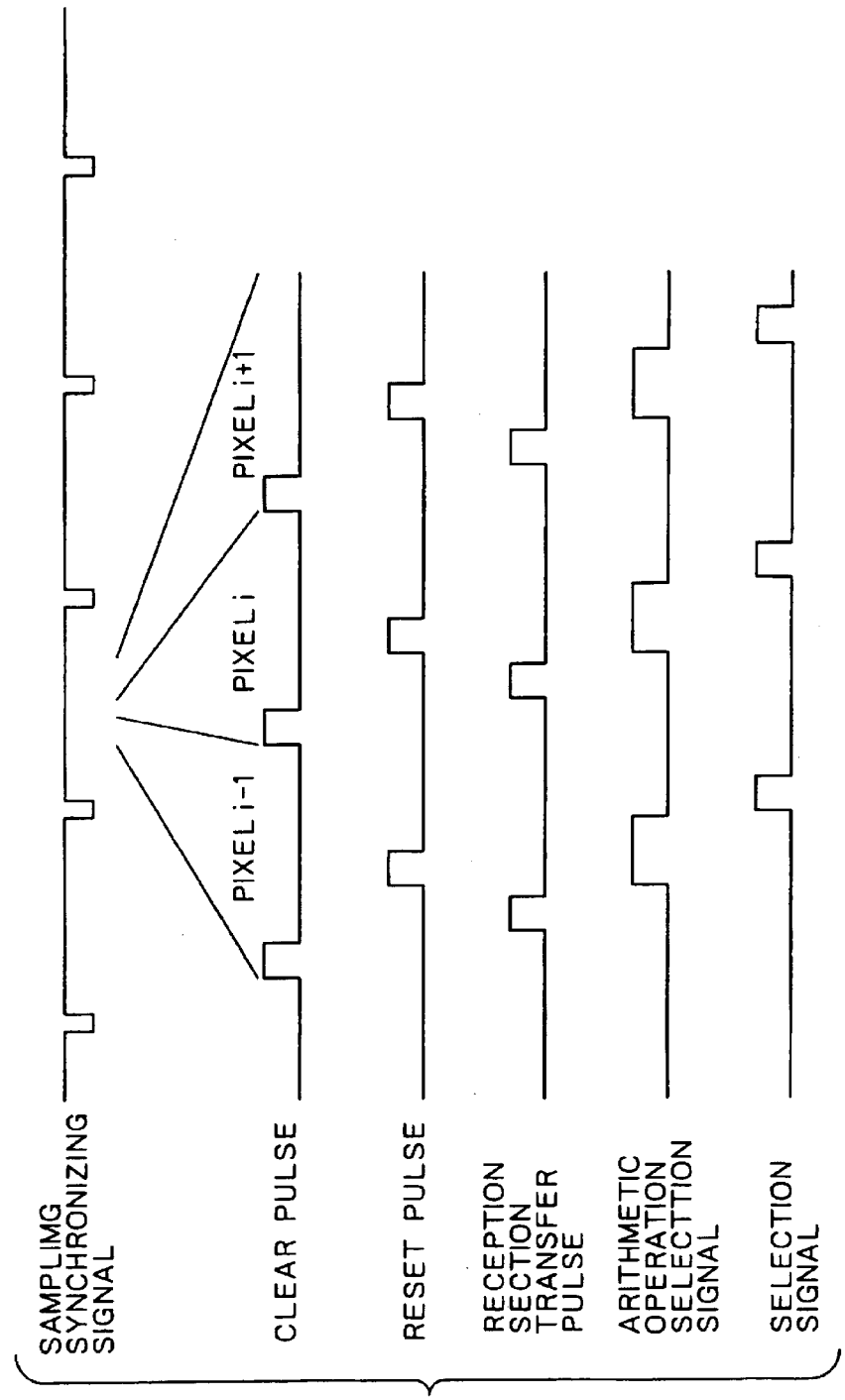

IMAGE PROCESSING APPARATUS AND METHOD

BACKGROUND OF THE INVENTION

This invention relates to an image processing apparatus and method.

A technique of arithmetically operating an image signal is being spread widely. This technique is utilized, for example, to determine a three-dimensional image of an imaging object by arithmetically operating an image signal.

In order to obtain a plurality of signals necessary for arithmetic operation, where-such an image pickup device as a CCD (Charge Coupled Device) is used, an image of an imaging object is picked up repetitively. Image signals obtained by the repetitive image picking up operations are stored into a memory device such as a frame memory. Then, the thus stored signals are read out from the storage device and used for such arithmetic operation as described above.

Also such a non-scanning type image pickup device as disclosed in Japanese Patent Publication No. hei 6-25653 has been proposed as a method and an apparatus for realizing real-time geometric measurement.

However, where an image of an imaging object is picked up repetitively, since the time of, for example, 33.3 msec or 16.6 msec is required for a single image picking up operation, there is a subject to be solved that this time required for the image pickup makes an upper limit and a result of arithmetic operation of image information cannot be obtained at a higher rate.

Also it is a subject to be solved that, since a result of arithmetic operation of an image signal cannot be obtained unless an image picking up operation is performed repetitively, a result of arithmetic operation cannot be obtained on the real-time basis.

In the non-scanning type image pickup device disclosed in Japanese Patent Publication No. hei 6-25653, since outputs of individual pixels arrayed on the image pickup device are handled independently of one another, output signal lines of the pixels cannot be formed as a common output signal line or lines. Further, since the non-scanning type image pickup device does not include storage means for the pixels, it has a subject to be solved that it loses such a characteristic of the "non-scanning type" that individual pixels operate independently of one another and consequently cannot perform real-time processing.

SUMMARY OF THE INVENTION

It is an object of the present invention to provide an image processing apparatus and method wherein image signals obtained by photoelectric conversion of light received individually by elements for receiving light from an object to be imaged can be arithmetically processed on the real-time basis.

In order to attain the object described above, according to the present invention, image signals obtained by photoelectric conversion of light received individually by elements for receiving light from an object to be imaged are arithmetically operated in accordance with a predetermined rule.

More particularly, according to an aspect of the present invention, there is provided an image processing apparatus having an optical area in which a plurality of elements are disposed in a matrix, comprising light reception means for receiving light introduced into the elements of the optical area and photoelectrically converting the light, arithmetic operation means for arithmetically operating a signal obtained for each of the elements by the photoelectric conversion by the light reception means in accordance with a predetermined rule, outputting means for outputting a result of the arithmetic operation of the arithmetic operation means for each of the elements, and timing adjustment means for adjusting a timing at which the result of the arithmetic operation is to be outputted for each of the plurality of elements from the outputting means.

The arithmetic operation means may include storage means for successively storing a plurality of signals at different timings obtained by the photoelectric conversion. In this instance, the arithmetic operation means may execute comparison arithmetic operation for a combination of a plurality of ones of the signals stored in the storage means. The comparison arithmetic operation may include an arithmetic operation for determining a maximum value or a minimum value of the signal.

The outputting means may output results of the arithmetic operation for each of the rows or the columns of the elements at a timing adjusted by the timing adjustment means.

According to another aspect of the present invention, there is provided an image processing method for an image processing apparatus which has an optical area in which a plurality of elements are disposed in a matrix, comprising a light reception step of receiving light introduced into the elements of the optical area and photoelectrically converting the light, an arithmetic operation step of arithmetically operating a signal obtained for each of the elements by the photoelectric conversion of the processing in the light reception step in accordance with a predetermined rule, an outputting step of outputting a result of the arithmetic operation of the processing in the arithmetic operation step for each of the elements, and a timing adjustment step of adjusting a timing at which the result of the arithmetic operation is to be outputted for each of the plurality of elements by the processing in the outputting step.

In the image processing apparatus and the image processing method, light introduced into each of the elements of the optical area is photoelectrically converted, and a signal obtained by the photoelectric conversion for each of the elements is arithmetically operated in accordance with the predetermined rule. Then, a result of the arithmetic operation is outputted for each of the elements. Consequently, arithmetic operation processing of image information can be performed on the real-time basis.

The above and other objects, features and advantages of the present invention will become apparent from the following description and the appended claims, taken in conjunction with the accompanying drawings in which like parts or elements denoted by like reference symbols.

BRIEF DESCRIPTION OF THE DRAWINGS

FIG. 7 is a flow chart illustrating operation of the image processing apparatus shown in FIG. 1;

FIG. 8 is a flow chart illustrating operation of a picture element shown in FIG. 2;

FIG. 9 is a timing chart illustrating operation of a picture element shown in FIG. 2;

FIG. 10 is a block diagram showing another construction of a distance sensor shown in FIG. 1; and FIG. 11 is a timing chart illustrating operation of the distance sensor of FIG. 10.

DESCRIPTION OF THE PREFERRED EMBODIMENT

Figure 1:
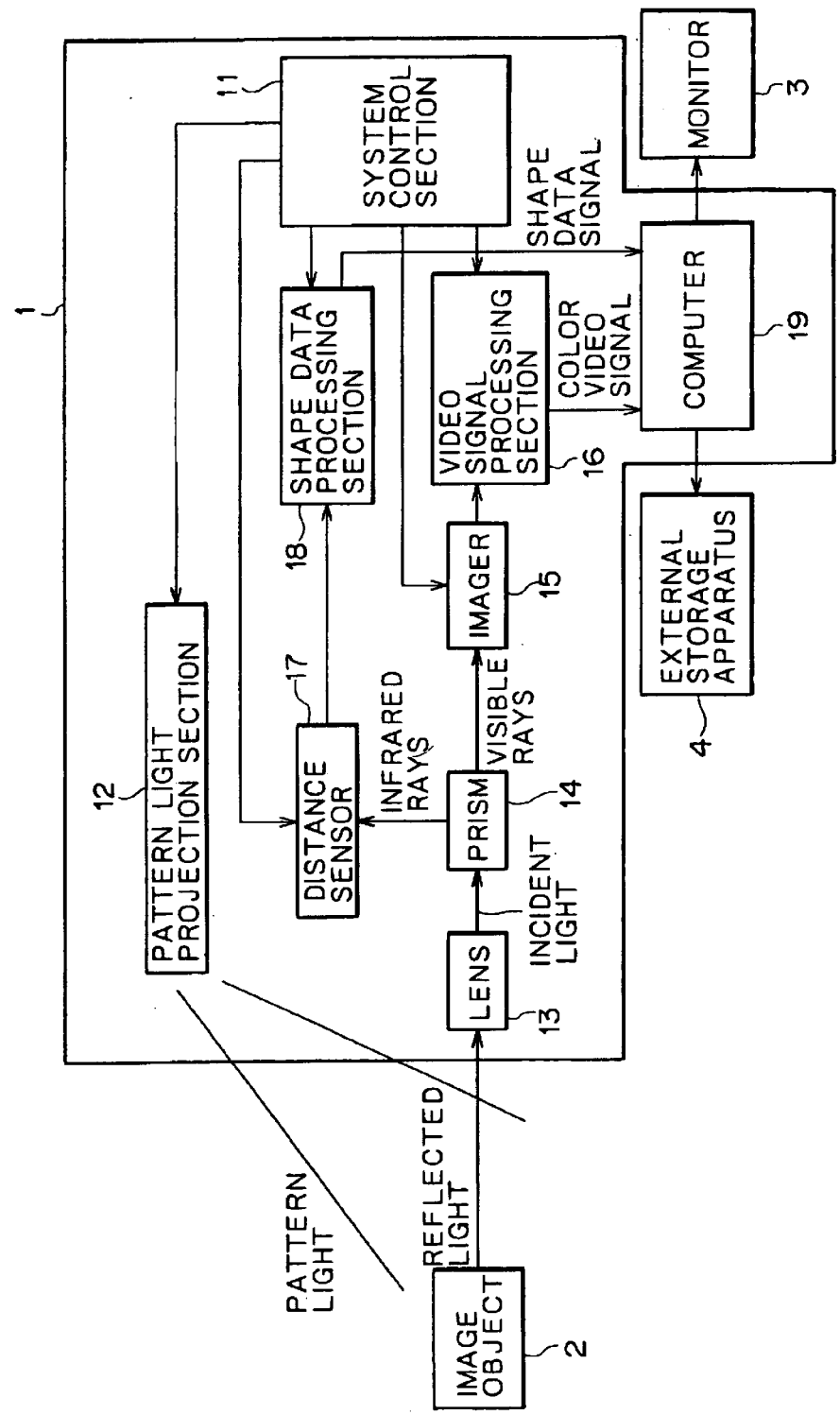
FIG. 1 is a block diagram showing a construction of an image processing apparatus to which the present invention is applied.

Referring first to FIG. 1, there is shown an image processing apparatus to which the present invention is applied. The image processing apparatus shown is generally denoted at 1 and includes a pattern light projection section 12, an imager 15, a video signal processing section 16, a distance sensor 17, a shape data processing section 18, and a system control section 11 which controls operation of the elements just mentioned.

The pattern light projection section 12 irradiates infrared rays of a pattern necessary for distance measurement toward an imaging object 2 in accordance with an instruction from the system control section 11. For the pattern light, slit light or grid light is used based on a principle of measurement of the distance sensor 17.

A lens 13 condenses light from the imaging object 2 and introduces the light into a prism 14. The prism 14 spectrally separates the incident light from the lens 13 into visible rays and infrared rays. In particular, since light from the imaging object includes not only visible rays but also reflected light from the imaging object of the infrared rays irradiated from the pattern light projection section 12 described above, it is spectrally separated into the visible rays and the infrared rays and outputs the visible rays to the imager 15 and the infrared rays to the distance sensor 17.

The imager 15 is formed from a CCD (Charge Coupled Device), a CMOS (Complementary Metal Oxide Semiconductor) or the like, and extracts color information from the visible rays inputted thereto from the prism 14 in response to a synchronizing signal, a control signal and so forth from the system control section 11 and outputs the extracted color information as a video signal to the video signal processing section 16.

The video signal processing section 16 performs gain adjustment, color adjustment processing and so forth for the video signal inputted thereto from the imager 15 in response to a synchronizing signal and a control signal from the system control section 11, converts, when necessary, the resulting video signal into an analog signal or a digital signal and outputs the analog or digital signal as a color video signal to a computer 19.

The distance sensor 17 receives the infrared rays introduced thereto from the prism 14, processes the received infrared rays in response to a synchronizing signal and a control signal from the system control section 11 into a binary digitized signal, and outputs the resulting signal to the shape data processing section 18. It is to be noted that details of the distance sensor 17 are hereinafter described.

The shape data processing section 18 determines, in response to a synchronizing signal and a control signal from the system control section 11, a timing at which the intensity of the infrared rays exhibits its peak from the binary digitized signal inputted thereto from the distance sensor 17, calculates a distance to the imaging object 2 based on the principle of triangular surveying from the determined intensity, and arithmetically operates a three-dimensional shape of the imaging object 2. Then, the shape data processing section 18 outputs a result of the arithmetic operation as a shape data signal to the computer 19.

The computer 19 performs computer graphics processing for the color video signal supplied thereto from the video signal processing section 16 and the shape data signal supplied thereto from the shape data processing section 18. The computer 19 outputs resulting data to a monitor 3, which may be formed from a CRT (Cathode Ray Tube), a LCD (Liquid Crystal Display) or the like, or to an external storage apparatus 4 so that the data may be stored into the external storage apparatus 4.

Figure 2:
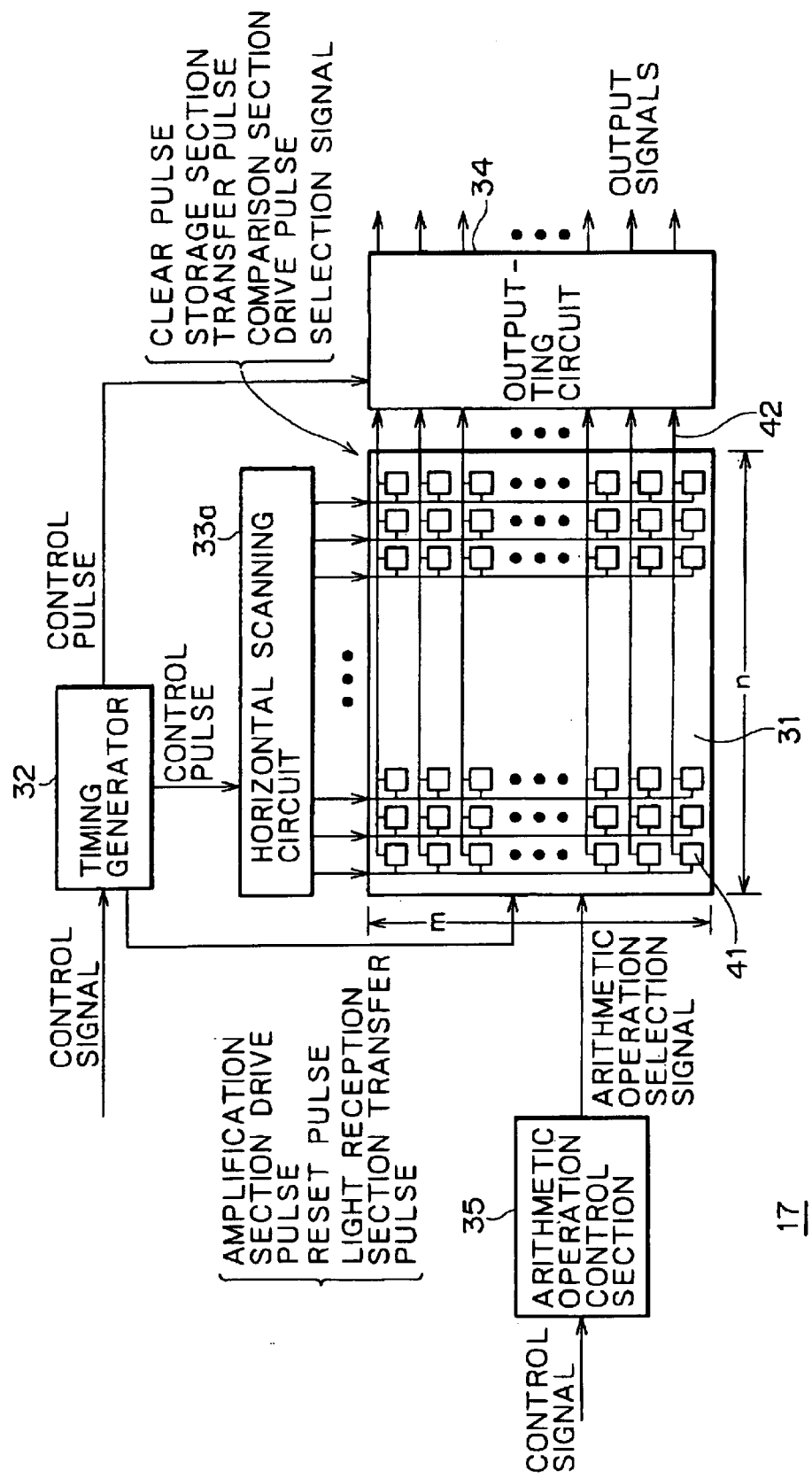
FIG. 2 is a block diagram showing a construction of a distance sensor of the horizontal type shown in FIG. 1.
Figure 3:
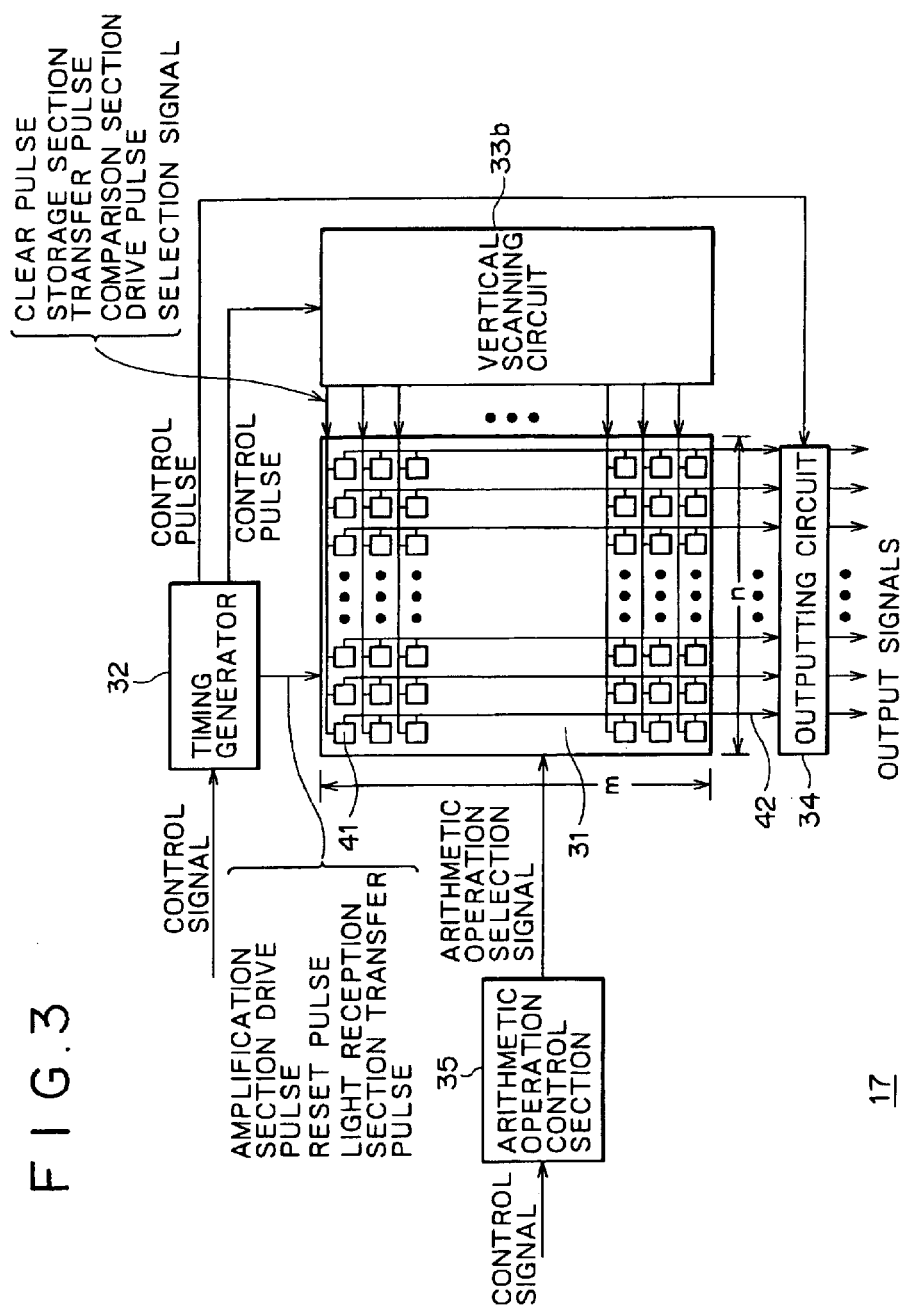
FIG. 3 is a block diagram showing a construction of a distance sensor of the vertical type shown in FIG. 1.

Now, details of the distance sensor 17 are described with reference to FIGS. 2 and 3. Distance sensors are roughly divided into two types, and the distance sensor 17 may be of any of the two types. In particular, where a first one of the two types is used, pixels 41 arrayed in a horizontal direction in an optical area 31 are successively scanned to extract output signals to be processed from the pixels 41. On the other hand, where a second one of the two types is used, pixels 41 arrayed in a vertical direction in an optical area 31 are successively scanned to extract output signals to be processed from the pixels 41. FIG. 2 shows a construction of the distance sensor 17 of the former type while FIG. 3 shows a construction of the distance sensor 17 of the latter type.

First, the distance sensor 17 of the horizontally scanning type is described with reference to FIG. 2.

The optical area 31 includes a plurality of pixels 41 having an arithmetic operation function and disposed in a matrix of n×m (=quantity in the horizontal direction× quantity in the vertical direction). Each of the pixels 41 arithmetically operates a signal corresponding to an amount of received light in response to a reset pulse signal and a light reception section transfer pulse signal outputted from a timing generator 32, and outputs a result of the arithmetic operation in a horizontal direction to an outputting circuit 34 over a common signal line 42 based on a selection signal supplied thereto from a horizontal scanning circuit 33a. It is to be noted that the pixels 41 are hereinafter described in detail.

The timing generator 32 supplies control pulse signal to the horizontal scanning circuit 33a and the outputting circuit 34 and generates and outputs an amplification section drive pulse signal, a reset pulse signal and a light reception section transfer pulse signal to the pixels 41 of the optical area 31 in accordance with a control signal from the system control section 11.

The horizontal scanning circuit 33a generates and supplies a clear pulse signal, a storage section transfer pulse signal, a comparison section drive pulse signal and a selection signal to the pixels 41 of the optical area 31 in accordance with a control pulse signal supplied thereto from the timing generator 32.

The outputting circuit 34 successively receives output signals of the pixels 41 of the optical area 31 over the common signal lines 42 in synchronism with a control pulse signal from the timing generator 32 and outputs the received output signals to the shape data processing section 18.

An arithmetic operation control section 35 supplies an arithmetic operation selection signal for selecting (designating) an arithmetic operation process to be executed by a matrix circuit 72 (FIG. 6) of a storage section 61 of an arithmetic operation section 53 of each of the pixels 41 in accordance with a control signal from the system control section 11. It is to be noted that the matrix circuit 72 of the storage section 61 of the arithmetic operation section 53 is hereinafter described in detail.

On the other hand, in the distance sensor 17 of the vertical scanning type shown in FIG. 3, a vertical scanning circuit 33b is provided in place of the horizontal scanning circuit 33a of the distance sensor 17 of the horizontal scanning type shown in FIG. 2, and outputs of the pixels 41 driven by the vertical scanning circuit 33b are successively supplied in a vertical direction to the outputting circuit 34 over the common signal lines 42. The other construction of the distance sensor 17 of FIG. 3 is similar to that of the distance sensor 17 of FIG. 2.

Figure 4:
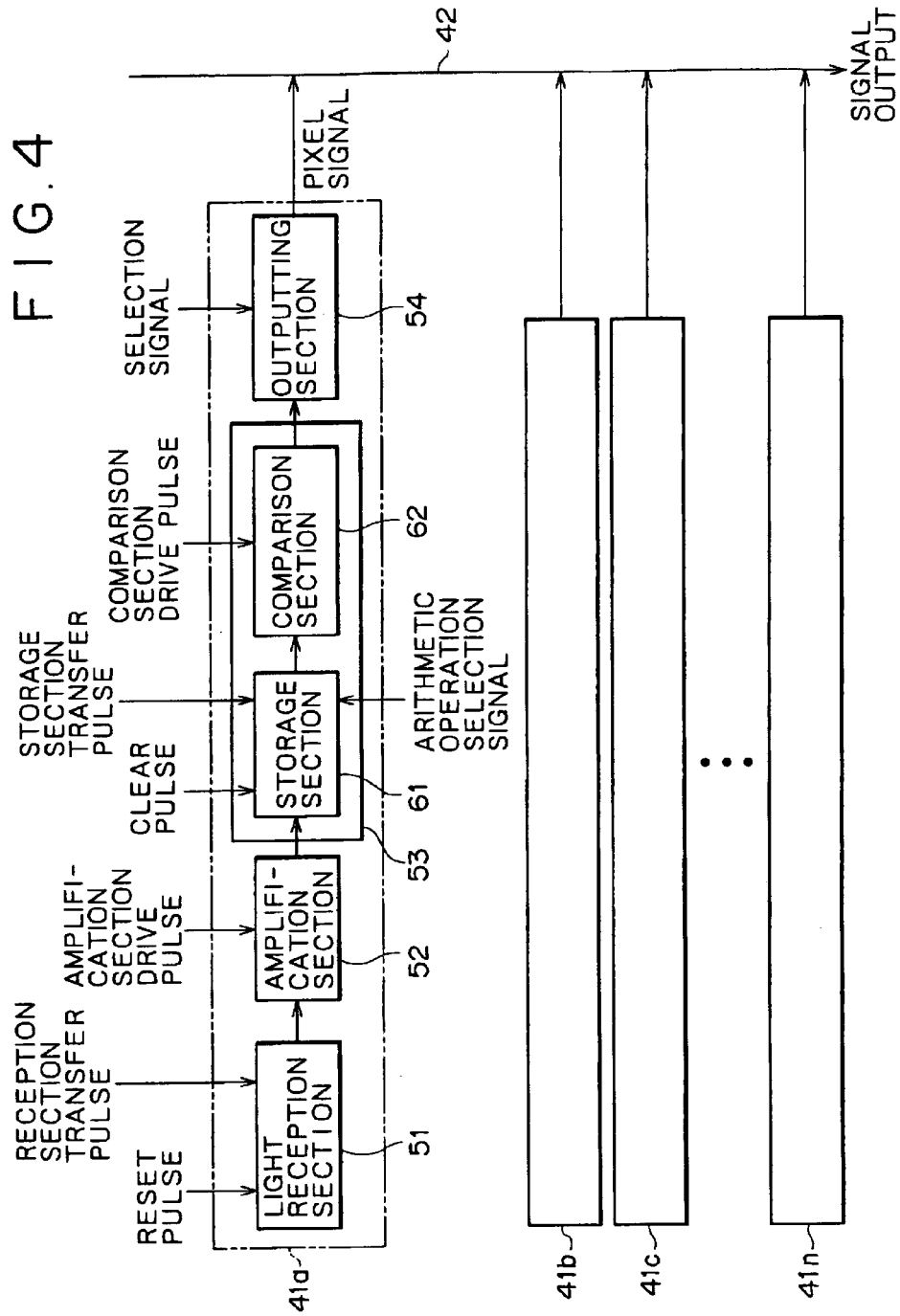
FIG. 4 is a block diagram showing a detailed construction of picture elements shown in FIG. 2.

Now, details of the pixels 41 are described with reference to FIG. 4. In FIG. 4, n pixels 41a to 41n connected to one of the common signal lines 42 shown in FIG. 2 are shown. Here, while a construction only of the pixel 41a is shown, also the other pixels 41b to 41n have a similar construction. This similarly applies to the distance sensor 17 of FIG. 3.

A light reception section 51 of the pixel 41a is formed from a light reception element such as, for example, a photodiode. The light reception section 51 receives infrared rays inputted thereto from the prism 14, photoelectrically converts the received infrared rays in response to a reset pulse signal supplied thereto from the timing generator 32, and outputs a resulting signal to an amplification section 52 in response to a light reception section transfer pulse signal supplied thereto from the timing generator 32.

The amplification section 52 amplifies the signal inputted thereto from the light reception section 51 to a level necessary for processing by an apparatus in the following stage in synchronism with an amplification section drive pulse signal supplied thereto from the timing generator 32, and outputs the signal of the amplified level to the arithmetic operation section 53.

The arithmetic operation section 53 includes a storage section 61 and a comparison section 62, and performs a predetermined arithmetic operation designated by an arithmetic operation selection signal from the arithmetic operation control section 35 for a signal inputted thereto from the amplification section 52 to produce a binary digitized signal and outputs the binary digitized signal to an outputting section 54. It is to be noted that the storage section 61 and the comparison section 62 are hereinafter described in detail.

The outputting section 54 outputs a signal inputted thereto from the arithmetic operation section 53 over the common signal line 42 as a pixel signal in synchronism with a selection signal from the horizontal scanning circuit 33a to the outputting circuit 34.

Before the storage section 61 and the comparison section 62 of the arithmetic operation section 53 are described, an arithmetic operation of a binary digitized signal of the arithmetic operation section 53 is described.

Figure 5:
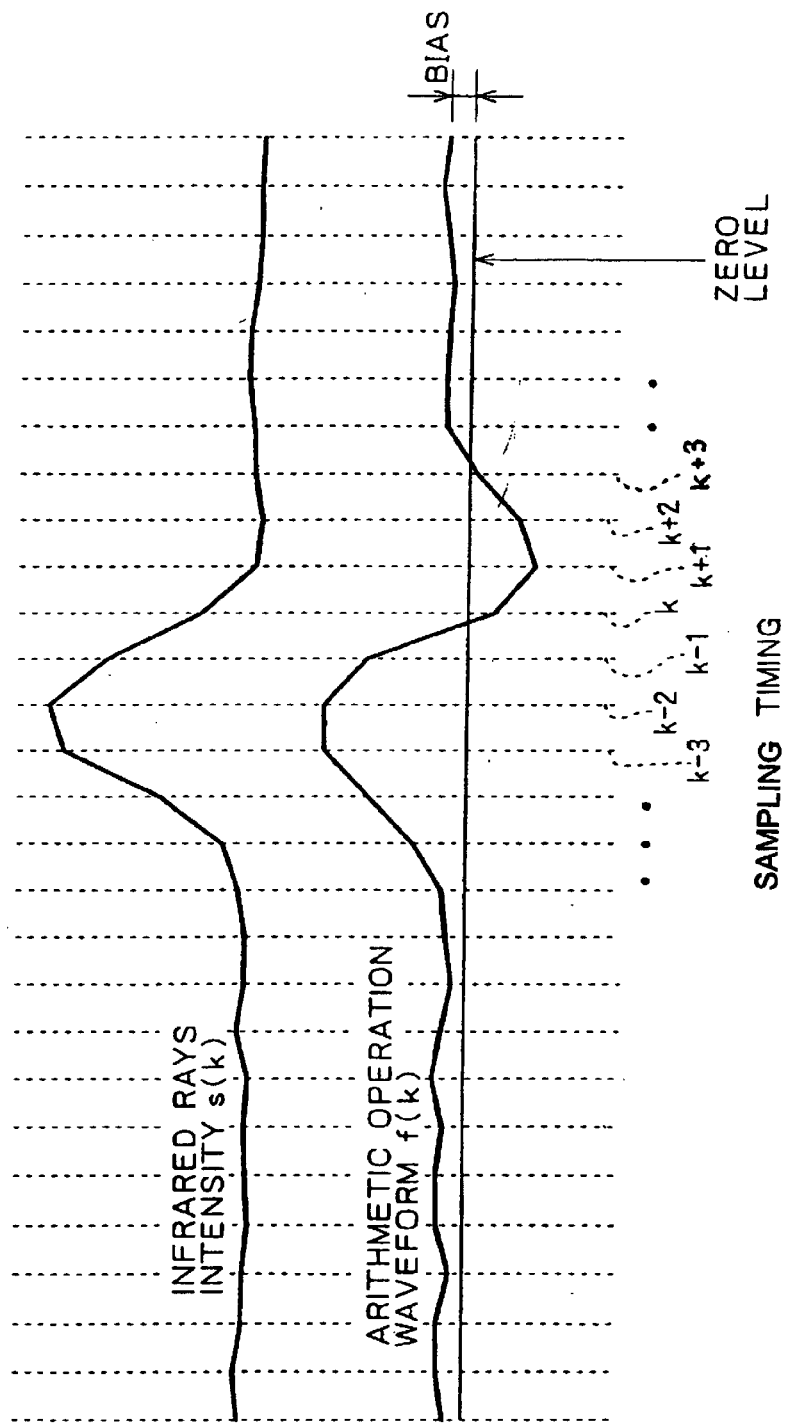
FIG. 5 is a graph illustrating an arithmetic operation method of a peak of light received.

A signal corresponding to the amount of received light by the light reception section 51 is amplified by the amplification section 52 and inputted to the arithmetic operation section 53. It is assumed that the sample signal s(k) of the intensity of the infrared rays of the received light varies together with the timing k of sampling as shown in FIG. 5. In this instance, each time the timing k varies, the sample signal of the infrared rays intensity is indicated as given below:

s(k−3), s(k−2), s(k−1), s(k), s(k+1), s(k+2), s(k+3), . . .

It is to be noted that k−1 has a value prior in time to k.

In this instance, as a function for detecting the time at which the intensity of the infrared rays exhibits its peak, such a function g(k) representing a displacement difference as given by the following expression (1) is considered:

$$g(k)=\{s(k)+s(k-1)\}-\{s(k-2)+s(k-3)\} \qquad (1)$$

This function g(k) substantially corresponds to differentiation of the sample signal s(k). If it is assumed that the function g(k) assumes a positive higher value as the sample signal s(k) of the infrared rays intensity increases, then when g(k)>0, the sample signal s(k) of the infrared rays intensity indicates an increase with respect to the variation of the time, but on the contrary when g(k)<0, the intensity of the sample signal s(k) of the infrared rays intensity indicates a decrease with respect to the variation of the time.

Accordingly, the timing k at which the function g(k) varies from a positive value to a negative value is the time at which the sampling signal of the infrared rays intensity exhibits its peak.

Thus, the time at which a peak of the sample signal of the infrared rays intensity is detected can be determined by a similar technique to that described above using a function f(k) indicated by the following expression (2) wherein a bias of a predetermined level is added to the function g(k) taking noise of the sample signal s(k) of the infrared rays intensity into consideration as seen from FIG. 5:

$$f(k)=\{s(k)+s(k-1)\}-\{s(k-2)+s(k-3)\}+BIAS \qquad (2)$$

As seen from FIG. 5, the function f(k) varies in response to a variation of the infrared rays intensity s(k), and the timing k at an intersecting point at which the value of the function f(k) illustrated in FIG. 5 varies from a positive value to a negative value across the zero level indicates the timing at which the infrared rays intensity s(k) exhibits its peak. It is to be noted that, in FIG. 5, the peak of the infrared rays intensity s(k) is at the sampling timing (k−2) displaced from the timing k. However, since this displacement has a fixed value which depends uniquely upon the function f(k), an accurate timing k at which the sample signal s(k) of the infrared rays intensity exhibits its peak can be determined by multiplying the timing calculated as above by a fixed offset.

The arithmetic operation section 53 outputs a binary digitized signal, which assumes 0 when the value of the function f(k) given above is in the positive or zero but assumes 1 when the value of the function f(k) is in the negative. The outputting circuit 34 outputs the received binary digitized signal as an output signal to the shape data processing section 18 in the following stage. The shape data processing section 18 in the following state determines the peak of the infrared rays intensity from the timing of sampling at which the infrared rays intensity determined from the binary digitized signal exhibits its peak, and calculates the distance to the imaging object from the peak value of the infrared rays intensity in accordance with a principle similar to that of the triangular surveying.

Figure 6:
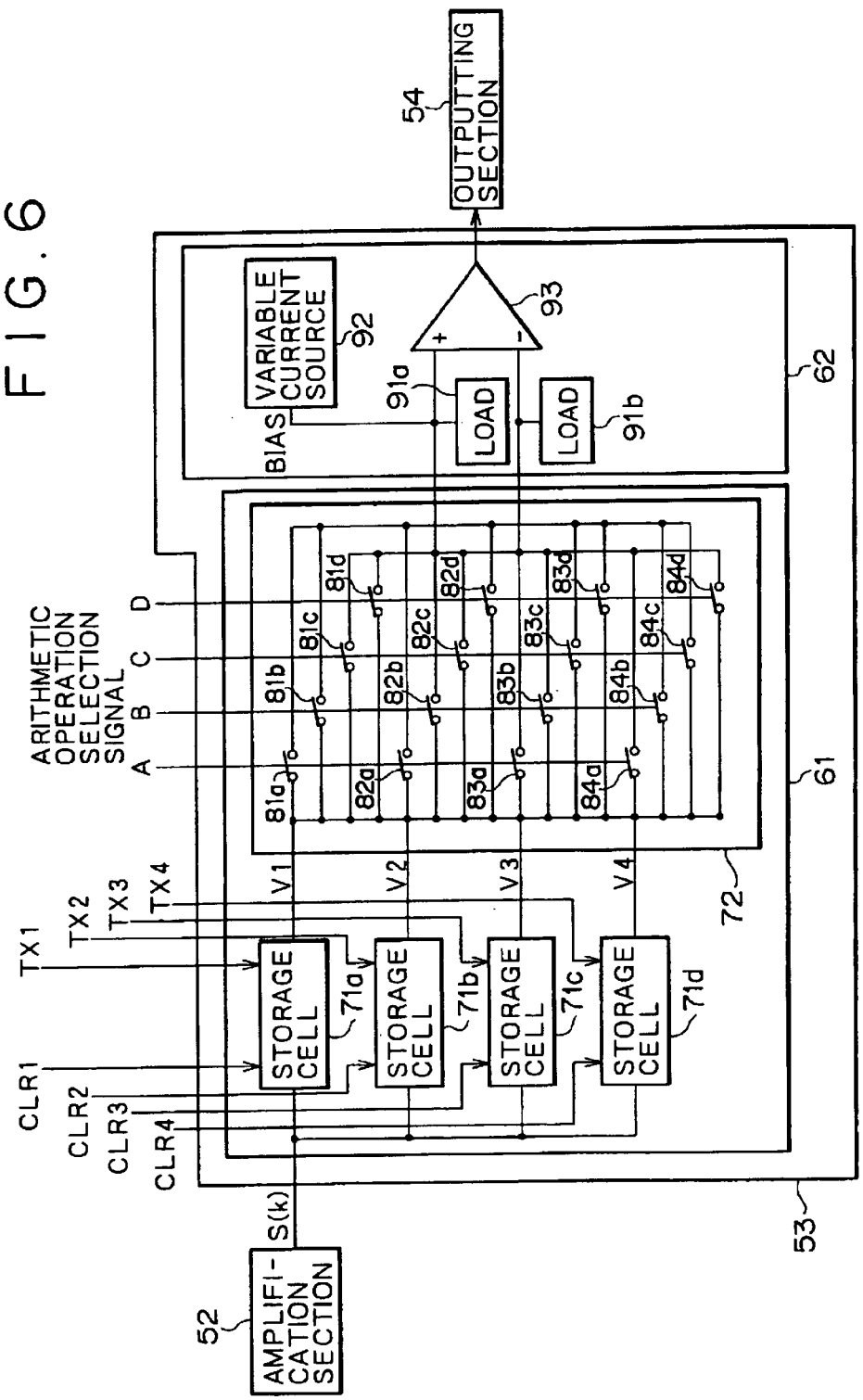
FIG. 6 is a diagrammatic view showing a detailed construction of an arithmetic operation section shown in FIG. 4.

Subsequently, the storage section 61 and the comparison section 62 of the arithmetic operation section 53 are described with reference to FIG. 6.

Storage cells 71a to 71d of the storage section 61 successively store a signal inputted from the amplification section 52 as a sample signal of the infrared rays intensity in response to clear pulse signals CLR1 to CLR4 sent thereto in synchronism with a sampling synchronizing signal from the horizontal scanning circuit 33a.

In particular, if it is assumed that, for example, at a certain timing k, a sample signal s(k) is stored in the storage cell 71a, another sample signal s(k−1) in the storage cell 71b, a further sample signal s(k−2) in the storage cell 71c and a still further sample signal s(k−3) in the storage cell 71d, then at the next timing k+1, a clear pulse signal CLR4 is sent from the horizontal scanning circuit 33a to the storage cell 71d which has the oldest signal stored therein so that the signal s(k−3) which is the preceding sample signal is erased from the storage cell 71d in synchronism with the clear pulse signal CLR4. Immediately after then, a signal from the amplification section 52 is inputted in synchronism with a reception light section transfer pulse signal sent thereto from the horizontal scanning circuit 33a, and thereupon, a sample signal s(k+1) which is a new sample signal of the infrared rays intensity is stored into the storage cell 71d. Thereafter, each time the timing k for sampling varies, a new sample signal of the infrared rays intensity is successively rewritten and stored into the storage cell which has the oldest sample signal of the infrared rays intensity currently stored therein similarly.

The sample signals of the infrared rays intensity stored in the storage cells 71a to 71d are outputted in parallel to a matrix circuit 72.

The matrix circuit 72 controls on/off switching of switches 81a to 84a, 81b to 84b, 81c to 84c and 81d to 84d in response to an arithmetic operation selection signal from the arithmetic operation control section 35. In particular, if the signals outputted from the storage cells 71a to 71d are represented by signals V1 to V4 and, at a certain timing k, for example, a sample signal s(k) is stored in the storage cell 71a, another sample signal s(k−1) in the storage cell 71b, a further sample signal s(k−2) in the storage cell 71c and a still further sample signal s(k−3) in the storage cell 71d, then the function f(k) to be arithmetically operated is represented by the following expression (3):

$$f(k)=\{s(k)+s(k-1)\}-\{s(k-2)+s(k-3)\}+BIAS \quad (3)$$

Consequently, $$f(k)=V1+V2-V3-V4+BIAS \quad (4)$$

Then at the next sampling timing k+1, the sample signal s(k−3) of the infrared rays intensity at the oldest timing k−3 stored in the storage cell 71d is replaced by a sample signal s(k+1). Consequently, the expression to be arithmetically operated is given by the following expression:

$$f(k+1)=\{s(k+1)+s(k)\}-\{s(k-1)+s(k-2)\}+BIAS \quad (5)$$

Consequently, $$f(k+1)=V4+V1-V2-V3+BIAS \quad (6)$$

Then, each time the sampling timing varies, arithmetic operations of the following four different expressions are repeated:

$$f(k)=V1+V2-V3-V4+BIAS \quad (7)$$

$$f(k+1)=V4+V1-V2-V3+BIAS \quad (8)$$

$$f(k+2)=V3+V4-V1-V2+BIAS \quad (9)$$

$$f(k+3)=V2+V3-V4-V1+BIAS \quad (10)$$

Where the combination of additions and subtractions is successively changed at each sampling timing to execute an arithmetic operation in this manner, stored signals themselves need not be transferred between storage cells. Consequently, deterioration of a signal and so forth which arises upon transfer can be suppressed.

Here, the arithmetic operation modes of the expressions (7) to (10) given above are defined as modes A to D, respectively.

Referring back to FIG. 6, the matrix circuit 72 controls on/off switching of the switches 81a to 84a, 81b to 84b, 81c to 84c and 81d to 84d in response to the arithmetic operation mode of an arithmetic operation selection signal transmitted thereto from the arithmetic operation control section 35. For example, if, at the timing k, an arithmetic operation selection signal of the mode A is transmitted from the arithmetic operation control section 35 to the matrix circuit 72, then the matrix circuit 72 switches the switches 81a to 84a on so that the signal V1 stored in the storage cell 71a and the signal V2 stored in the storage cell 71b are supplied to a positive input of a differential amplification circuit 93 of the comparison section 62 and the signal V3 stored in the storage cell 71c and the signal V4 stored in the storage cell 71d are supplied to a negative input of the differential amplification circuit 93 of the comparison section 62.

A load 91a to the comparison section 62 is connected to the positive input of the differential amplification circuit 93 while another load 91b to the comparison section 62 is connected to the negative input of the differential amplification circuit 93, and the loads 91a and 91b convert currents inputted thereto from the storage cells 71a to 71d into voltages. A variable current source 92 generates bias current and supplies the bias current to the positive input of the differential amplification circuit 93 so that the bias current is added as BIAS in the expressions (7) to (10) to one of signals of the storage cells 71a to 71d which is inputted to the positive input of the differential amplification circuit 93. The differential amplification circuit 93 arithmetically operates a difference between signals to the positive input and the negative input thereof.

For example, if an arithmetic operation selection signal of the mode A is inputted from the arithmetic operation control section 35 to the matrix circuit 72 of the storage section 61, then the switches 81a to 84a are switched on, and the signal V1 stored in the storage cell 71a and the signal V2 stored in the storage cell 71b are inputted to the positive input of the differential amplification circuit 93 of the comparison section 62. Further, the signal V3 stored in the storage cell 71c and the signal V4 stored in the storage cell 71d are inputted to the negative input of the differential amplification circuit 93 of the comparison section 62. Accordingly, the differential amplification circuit 93 executes the arithmetic operation of the expression (7).

It is to be noted that, while the comparison section 62 uses the differential amplification circuit 93, it may otherwise use a chopper type comparison circuit instead.

Subsequently, operation of the image processing apparatus 1 is described with reference to a flow chart of FIG. 7.

In step S1, pattern light (infrared rays) is generated by the pattern light projection section 12 in accordance with a control signal from the system control section 11 and irradiated toward the imaging object 2. Then, infrared rays and visible rays reflected from the imaging object 2 are condensed by the lens 13 and introduced into the prism 14.

In step S2, the incident light is spectrally separated into the visible rays and the infrared rays by the prism 14. The visible rays thus spectrally separated are introduced into the imager 15 while the infrared rays are introduced into the distance sensor 17.

In step S3, the imager 15 extracts color information from the visible rays and outputs the color information to the video signal processing section 16. The video signal processing section 16 performs gain adjustment and color signal processing for the color information inputted thereto and outputs resulting information as a color video signal to the computer 19. Meanwhile, the distance sensor 17 receives the infrared rays at the pixels 41 thereof and produces and outputs a binary digitized signal, from which a peak of the intensity of the infrared rays can be detected, to the shape data processing section 18. It is to be noted that the processing of the pixels 41 of the distance sensor 17 is hereinafter described. The shape data processing section 18 determines a sampling timing at which the infrared rays exhibit a peak from the binary digitized signal from the distance sensor 17, arithmetically operates the distance to the imaging object 2 in accordance with the principle of triangular surveying from the infrared rays intensity at the sampling timing, and outputs the resulting distance as a shape data signal to the computer 19.

In step S4, the computer 19 combines the color video signal and the shape data signal inputted thereto, performs computer graphics processing for the combined signal and outputs a resulting signal to the monitor 3 or outputs it to the external storage apparatus 4 so that it is stored into the external storage apparatus 4, thereby ending the processing.

Subsequently, operation when V1=s(k−4), V2=s(k−1), V3=s(k−2) and V4=s(k−3) as sample signals of the infrared rays intensity are stored in the storage cells 71a to 71d, respectively, of the pixels 41 of the distance sensor 17 of FIG. 2 at the sampling timing k−1 in the timing chart of FIG. 9 is described with reference to a flow chart of FIG. 8 and a timing chart of FIG. 9.

If a reset pulse signal transmitted from the timing generator 32 is inputted to the light reception section 51 immediately after the sampling timing k−1 in step S11, then the light reception section 51 resets the reception light level and starts reception of the infrared rays newly (an accumulation phase in FIG. 9).

In step S12, the light reception section 51 photoelectrically converts the newly received infrared rays in synchronism with a light reception section transfer pulse signal (not shown) from the timing generator 32 and outputs a resulting signal to the amplification section 52.

In step S13, the amplification section 52 amplifies the signal inputted thereto from the light reception section 51 in synchronism with an amplification section drive pulse signal (not shown) from the timing generator 32 and outputs the amplified signal to the arithmetic operation section 53.

In step S14, the arithmetic operation section 53 erases the signal s(k−4) of the storage cell 71a, which is the oldest signal, in synchronism with a clear pulse signal CLR1 (FIG. 9) from the horizontal scanning circuit 33a, and then stores the signal from the amplification section 52 into the storage cell 71a in synchronism with a storage section transfer pulse signal TX1 (FIG. 9) from the horizontal scanning circuit 33a.

In step S15, the storage cells 71a to 71d outputs the signals V1 to V4 stored therein to the matrix circuit 72.

In step S16, the matrix circuit 72 switches the switches 81a to 84a on in response to a signal of the mode A of an arithmetic operation selection signal from the arithmetic operation control section 35. Of the signals V1 to V4 inputted from the storage cells 71a to 71d, the signals V1 and V2 are supplied to the positive input of the differential amplification circuit 93 of the comparison section 62, and the signals V3 and V4 are inputted to the negative input of the differential amplification circuit 93.

In step S17, a signal obtained by adding the bias BIAS supplied from the variable current source 92 to the signals V1 and V2 inputted to the positive input of the differential amplification circuit 93 from the matrix circuit 72 and the signals V3 and V4 inputted to the negative input are converted from currents into voltages by the loads 91a and 91b, respectively. The differential amplification circuit 93 of the comparison section 62 executes arithmetic operation of the expression (7) given hereinabove from the signals V1 to V4 and the bias BIAS in synchronism with a comparison section drive pulse signal (not shown) from the horizontal scanning circuit 33a (in FIG. 9, an arithmetic operation phase). Then, a result of the arithmetic operation is outputted to the outputting section 54. In the example of FIG. 9, "1" is outputted, and this indicates that a peak of the received infrared rays intensity has been detected.

In step S18, the outputting section 54 outputs the result of the arithmetic operation as a pixel signal to the outputting circuit 34 over the common signal line 42 (in FIG. 9, an output phase) in synchronism with a selection signal from the horizontal scanning circuit 33a (which corresponds to the sampling timing k+1 of the sampling synchronizing signal).

In step S19, the outputting circuit 34 outputs the pixel signal to the shape data processing section 18 in synchronism with a control pulse signal from the timing generator 32 and ends the processing.

It is to be noted that the processing described above is repeated for each sampling timing as seen from FIG. 9. In particular, the processing enters an accumulation phase of the arithmetic operation mode A at a reset pulse signal immediately after the sampling timing k−1, and enters an arithmetic operation phase at a clear pulse signal CLR4. Then, with a reset pulse signal at the sampling timing k, the processing enters a next accumulation phase of an arithmetic operation of the mode B, and thereafter, the cycle described is repeated.

In the foregoing description, the light reception section 51, amplification section 52, arithmetic operation section 53 and outputting section 54 are provided in each of the pixels 41. However, the arithmetic operation section 53 and the outputting section 54 may alternatively be provided outside the pixel 41 as seen in FIG. 10. FIG. 10 shows a modified distance sensor 17 wherein the arithmetic operation section 53 and the outputting section 54 of each of the pixels 41 of the distance sensor 17 which corresponds to that of FIG. 2 are provided separately.

In FIG. 10, like elements to those of FIG. 2 are denoted by like reference characters and overlapping description of them is suitably omitted herein to avoid redundancy. In the distance sensor 17 of FIG. 10, pixel output lines 101 and a storage arithmetic operation area 102 are provided newly. Pixel signals from the pixels 41 in the optical area 31 are outputted to the corresponding storage sections 61 in the storage arithmetic operation area 102 over the corresponding pixel output lines 101. Each of the pixels 41 shown in FIG. 10 includes the light reception section 51 and the amplification section 52 of FIG. 4, and elements serving as the arithmetic operation section 53 and the outputting section 54 following the light reception section 51 and the amplification section 52, respectively, are provided in the storage section 61 corresponding to the pixel 41 of the storage operation area 102. The arithmetic operation section 53 and the outputting section 54 are connected to a corresponding one of the pixel output lines 101. Where the arithmetic operation sections and the outputting sections of the pixels 41 are provided separately in this manner, the pixels 41 can be arranged efficiently in the optical area 31.

FIG. 11 is a timing chart illustrating processing of a plurality of pixels 41 of the optical area 31 and the storage arithmetic operation area 102 of FIG. 10. In particular, for example, with regard to the pixel i−1, the storage section 61 of the storage arithmetic operation area 102 stores, at the sampling timings k and k+1 of FIG. 9, a signal inputted thereto in synchronism with a transfer pulse signal from the light reception section 51 through the amplification section 52 and over the pixel output line 101 into a storage cell (one of the storage cells 71a to 71d in which data of the oldest timing is stored) from which data has been erased in synchronism with a clear pulse signal. Then, the light reception section 51 corresponding to the storage section 61 is reset by a reset pulse signal and starts light reception newly. On the other hand, the signals stored in the storage cells 71a to 71d are arithmetically operated in response to an arithmetic operation selection signal inputted from the arithmetic operation control section 35, and a result of the arithmetic operation is outputted to the outputting section 54. Then, the outputting section 54 outputs the received signal to the outputting circuit 34 over the common signal line 42 in synchronism with a selection signal from the horizontal scanning circuit 33a. Thereafter, the next pixel i executes the processing illustrated in FIG. 9 at the sampling timings k and k+1 same as those for the pixel i−1. It is to be noted that, while the distance sensor 17 of FIG. 10 is of the horizontal scanning type same as that of FIG. 2, it may have a construction otherwise of the vertical scanning type shown in FIG. 3.

While, in the foregoing description, the image processing apparatus executes three-dimensional image processing, it may execute some other processing which requires arithmetic operation processing together with image processing. For example, the image processing apparatus may be applied also to a thermography apparatus which measures a temperature distribution together with image information, or may be applied to a three-dimensional thermography apparatus by combining the three-dimensional image processing described above and the thermography apparatus.

Where each of the pixels 41 has an arithmetic operation function as described above, image processing on the real-time basis is allowed.

While preferred embodiments of the present invention have been described using specific terms, such description is for illustrative purposes only, and it is to be understood that changes and variations may be made without departing from the spirit or scope of the following claims.

What is claimed is:

1. An image processing apparatus having an optical area in which a plurality of elements are disposed in a matrix having rows and columns, comprising:

light reception means for receiving light introduced into said elements of said optical area and photoelectrically converting the light;

a plurality of operating units, each of which operates a signal obtained for a corresponding one of said elements by the photoelectric conversion by said light reception means in accordance with a predetermined rule, the operation of said operating units being based on at least one of a clear signal and a transfer signal;

a plurality of outputting units, each for receiving a result of the operation of a corresponding one of said operating units and outputting the result of the operation for each of said corresponding one of said elements; and timing adjustment means for adjusting a timing at which the result of the operation is output for each of said plurality of elements from said outputting units, said timing adjustment means using a control signal other than the clear signal or the transfer signal in the timing adjustment.

2. An image processing apparatus according to claim 1, wherein said operating units include storage means for successively storing a plurality of signals at different timings obtained by the photoelectric conversion.

3. An image processing apparatus according to claim 2, wherein said operating units execute a comparison operation for a combination of a plurality of ones of the signals stored in said storage means.

4. An image processing apparatus according to claim 3, wherein the comparison operation includes an arithmetic operation for determining a maximum value or a minimum value of the signal.

5. An image processing apparatus according to claim 1, wherein said outputting units output results of an arithmetic operation for each of the rows or the columns of said corresponding elements at a timing adjusted by said timing adjustment means.

6. An image processing apparatus according to claim 1, wherein said operating units perform an arithmetic operation.

7. An image processing apparatus according to claim 1, wherein the operating units store and operate a plurality of photoelectrically converted signals received by one of said elements at predetermined timing intervals.

8. An image processing apparatus according to claim 7, wherein the operating units store and operate the photoelectrically converted signals in the order in which the signals are received.

* * * * *